(12) United States Patent
Lee (10) Patent No.: US 7,608,508 B2
(45) Date of Patent: Oct. 27, 2009

(54) METHOD FOR MANUFACTURING SEMICONDUCTOR DEVICE

(75) Inventor: Sang Don Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 43 days.

(21) Appl. No.: 11/529,540

(22) Filed: Sep. 29, 2006

(65) Prior Publication Data

US 2007/0224762 A1    Sep. 27, 2007

(30) Foreign Application Priority Data

Mar. 24, 2006 (KR) ............. 10-2006-0027005

(51) Int. Cl.
*H01L 21/336* (2006.01)
(52) U.S. Cl. .............. 438/259; 257/E29.321
(58) Field of Classification Search ........... 438/259
See application file for complete search history.

(56) References Cited

U.S. PATENT DOCUMENTS

2006/0097314 A1* 5/2006 Uchiyama ............. 257/330

FOREIGN PATENT DOCUMENTS

KR   1020000045462 A   7/2000

OTHER PUBLICATIONS

J.Y. Kim et al., "The Breakthrough in data retention time of DRAM using Recess-Channel-Array Transistor (RCAT) for 88nm feature size and beyond", 2003 Symposium on VLSI Technology Digest of Technical Papers, pp. 11-12.

J.Y. Kim et al., "S-RCAT (Sphere-shaped-Recess-Channel-Array Transistor) Technology for 70nm DRAM feature size and beyond", 2005 Syposium on VLSI Technology Digest of Technical Papers, pp. 34-35.

Sung Min Kim et al., "A Novel Multi-Channel Field Effect Transistor (McFET) on Bulk Si for High Performance Sub-80nm Application", 2004. IEEE.

* cited by examiner

*Primary Examiner*—Brook Kebede
*Assistant Examiner*—Tony Tran
(74) *Attorney, Agent, or Firm*—Townsend and Townsend and Crew LLP (57) ABSTRACT

A method for manufacturing a semiconductor device includes forming a recess with a device separating film and a first hard mask layer so that a pad nitride film for defining a recess gate region may remain with a conventional mask. The method additionally the recess gate region to facilitate a subsequent process for etching a gate electrode without a step difference between the device separating film.

14 Claims, 10 Drawing Sheets

METHOD FOR MANUFACTURING SEMICONDUCTOR DEVICE

BACKGROUND OF THE INVENTION

The present invention generally relates to a method for manufacturing a semiconductor device, and more specifically, to a technology of etching a semiconductor substrate with a first recess gate for defining a recess gate region as a mask in formation of a recess gate, thereby preventing generation of a height difference from the semiconductor substrate because a device separating film except the recess gate region is etched due to an etching selectivity.

As a channel length of a cell transistor is decreased, an ion concentration of a cell channel is increased to adjust a threshold voltage of the cell transistor. As a result, an electric field of source/drain regions is increased and leakage current is increased so that a refresh characteristic of a DRAM is degraded.

Figure 1:
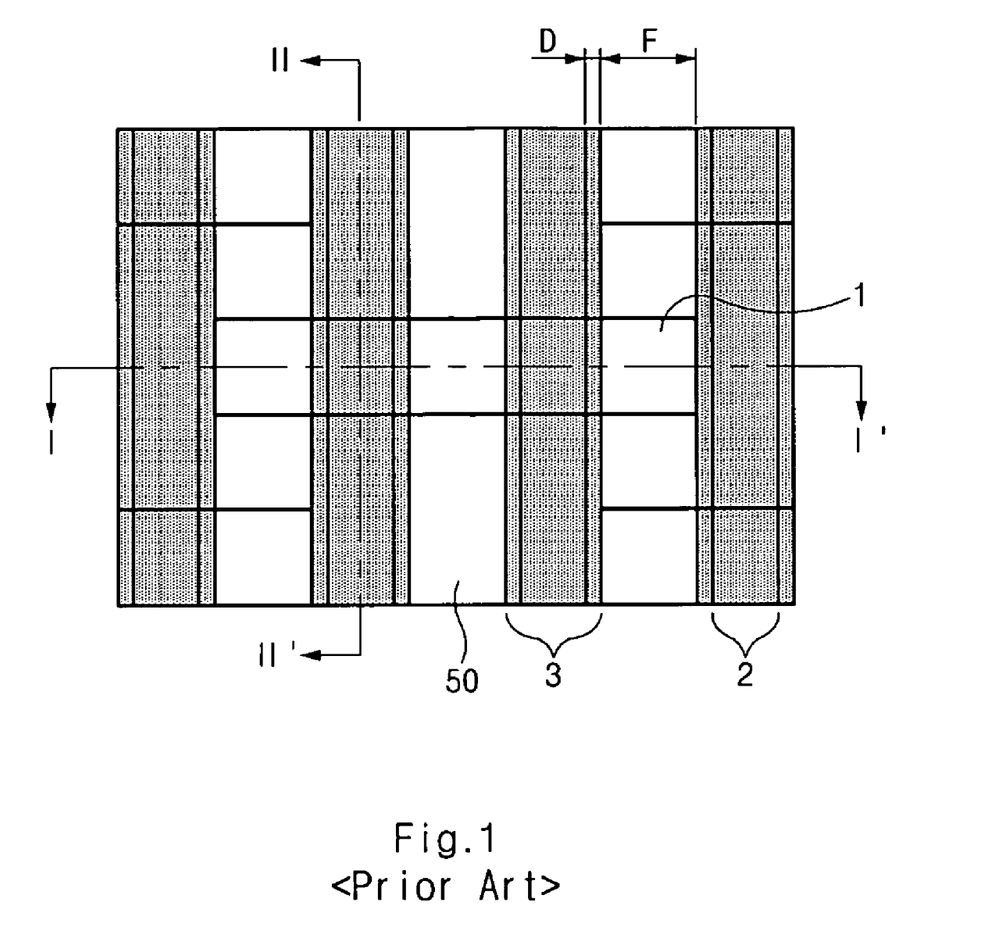
FIG. 1 is a layout diagram illustrating a conventional semiconductor device.

FIG. 1 is a layout diagram illustrating a conventional semiconductor device to increase the channel length of the cell transistor.

The conventional semiconductor device of FIG. 1 includes an active region 1, a recess gate region 2 and a gate region 3.

The linewidth of the recess gate region 2 is shown to be narrower by 2D than that of the gate region 3. The width between the gate regions 3 is shown to be F.

Figure 2A:
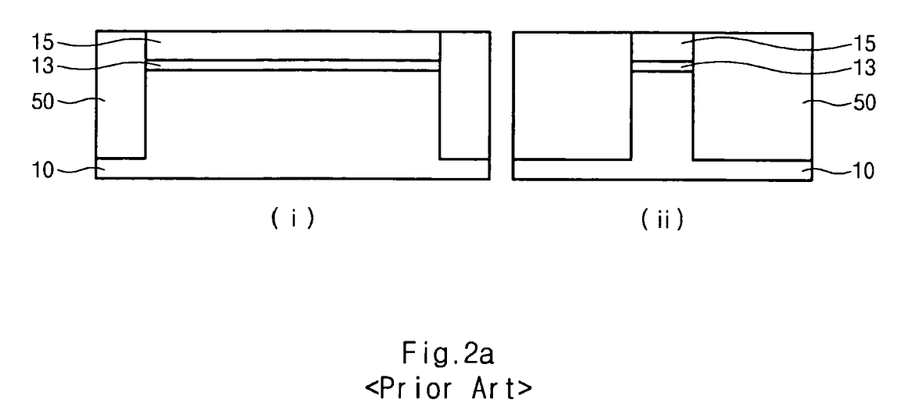
FIGS. 2a through 2f are diagrams illustrating a conventional process for manufacturing a semiconductor device.

FIGS. 2a through 2f are diagrams illustrating a conventional process for manufacturing a semiconductor device. FIGS. 2a(i) through 2f(i) are cross-sectional diagrams taken along the line I-I' of FIG. 1, and FIGS. 2a(ii) through 2f(ii) are cross-sectional diagrams taken along the line II-II' of FIG. 1.

A device separating film 50 is formed over a semiconductor substrate 10 including a pad oxide film 13 and a pad nitride film 15.

Figure 2B:
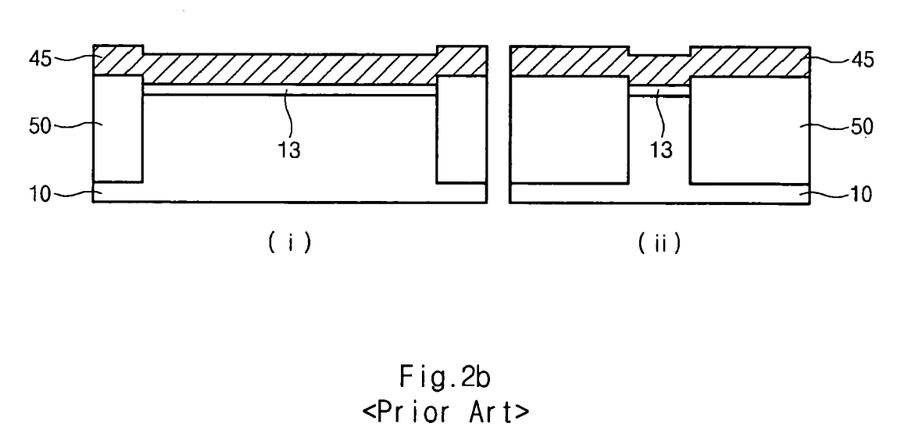

After the pad nitride film 15 is removed, ions are implanted into the resulting structure to form well and channel ion-implanting regions (not shown). Then, a polysilicon layer 45 is formed over the resulting structure.

Figure 2C:
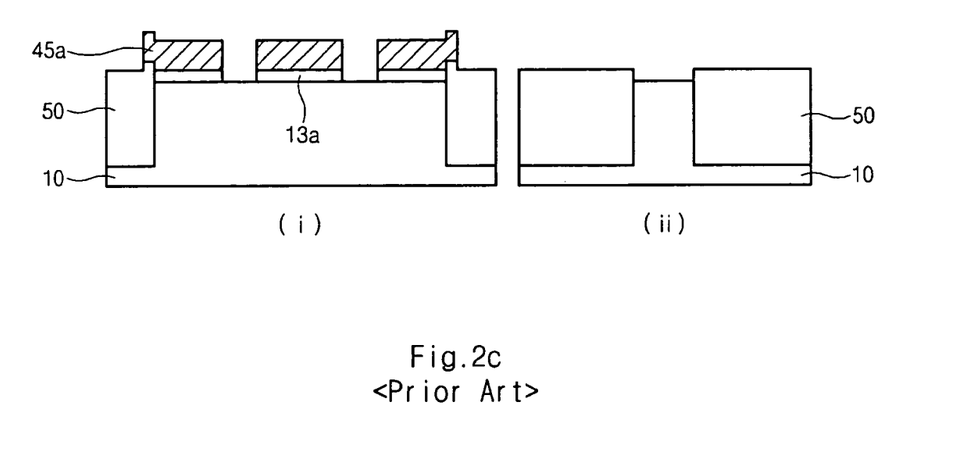

The polysilicon layer 45 and the pad oxide film 13 are etched with the first gate mask (not shown) which defines a recess gate region as an etching mask to form a polysilicon pattern 45 and a pad oxide pattern 13a which define the recess gate region 2 of FIG. 1.

Figure 2D:
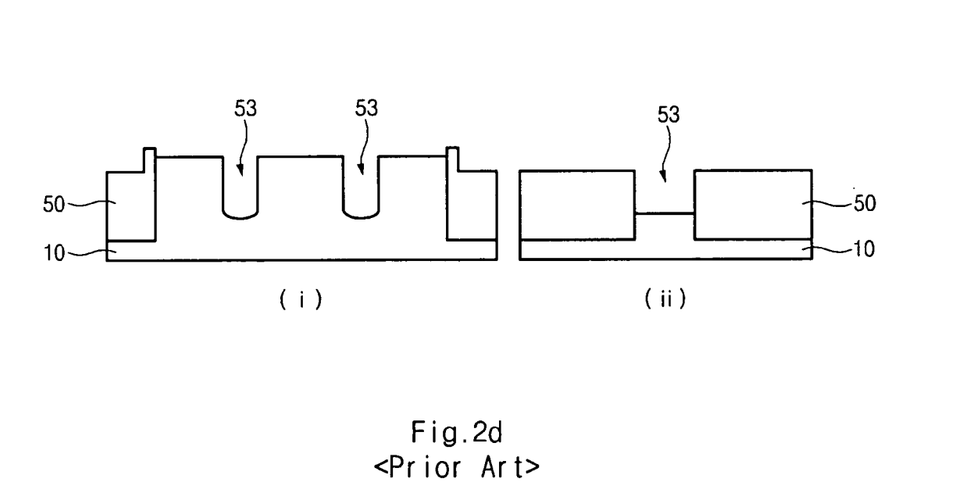

The semiconductor substrate 10 of the recess gate region 2 of FIG. 1 is etched at a predetermined thickness to form a recess 53. Here, the polysilicon pattern 45a is simultaneously removed when the recess 53 is formed. The semiconductor substrate 10 adjacent to the device separating film 50 has a relatively slower etching speed to cause a silicon horn.

Figure 2E:
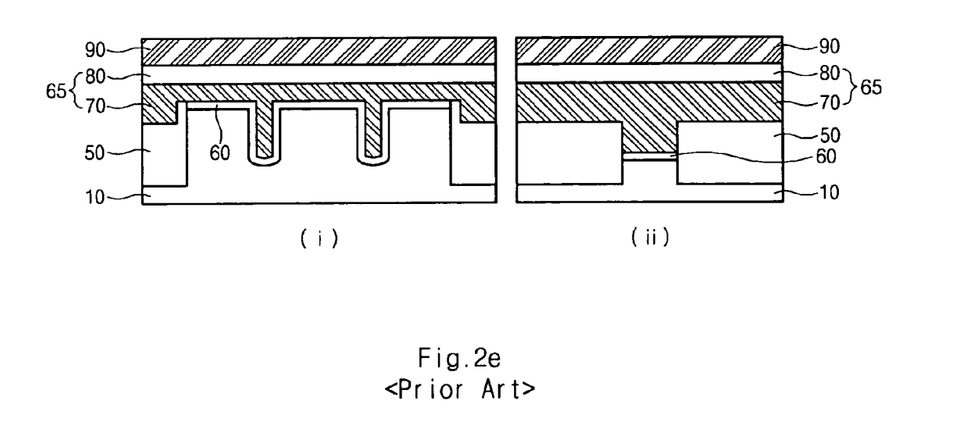

A gate insulating film 60 is formed over the exposed semiconductor substrate 10. Then, a gate conductive layer 65 for filling the recess 53 is formed, and a hard mask layer 90 is formed thereon. The gate conductive layer 65 has a deposition structure including a bottom electrode 70 and a top electrode 80.

Figure 2F:
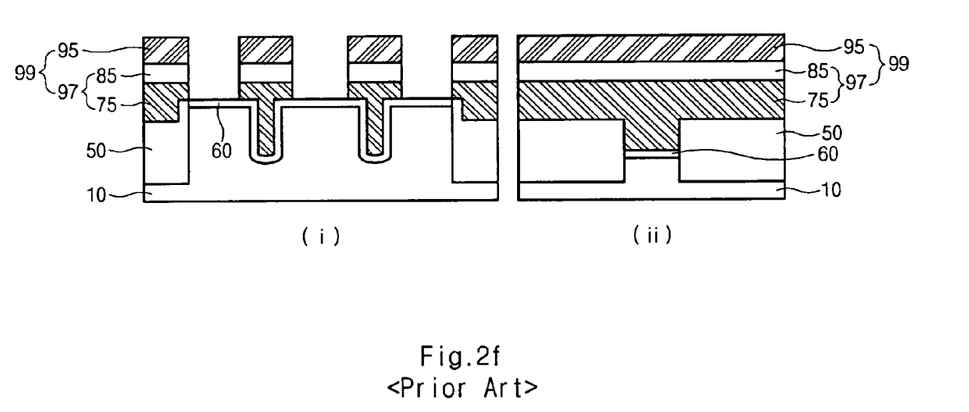

The hard mask layer 90 and the gate conductive layer 65 are patterned with a second gate mask (not shown) for defining a gate as an etching mask to form a gate 99.

A thickness difference of bottom electrodes over the gate insulating film 60 and the device separating film makes the surface of the device separating film 50 lower than that of the silicon substrate, and causes the bottom electrode 75 of the gate formed over the silicon substrate which is an active region to be over-etched in order to etch the thick bottom electrode of the device separating film. Also, the conventional method for manufacturing a semiconductor device increases word line capacitance after the gate is formed, and degrades the operating speed of the DRAM and a refresh characteristic of the semiconductor device resulting from increase of leakage current.

SUMMARY OF THE INVENTION

Various embodiments are directed at a method for manufacturing a semiconductor device including forming a recess with a device separating film and a first hard mask layer so that a pad nitride film for defining a recess gate region may remain with a conventional mask. The method additionally defines the recess gate region to facilitate a subsequent process for etching a gate electrode without a step difference between the device separating film and a semiconductor substrate and to improve a refresh characteristic of the device.

According to an embodiment of the present invention, a method for manufacturing a semiconductor device comprises:

forming a deposition structure including a pad oxide film and a pad nitride film which expose a device separating region of a semiconductor substrate;

etching the semiconductor substrate with the pad oxide film and the pad nitride film as an etching mask to form a trench which defines an active region;

forming an insulating film for separating the device which fills the trench and planarizing the insulating film until the pad nitride film is exposed to form a device separating film;

etching the pad nitride film and the device separating film by an exposing and etching process with a first gate mask which defines a line-type recess gate region to expose the pad oxide film except the recess gate region;

forming a first hard mask layer which fills the exposed region;

removing the residual pad nitride film and pad oxide film with the first hard mask layer and the device separating film as an etching mask to expose the semiconductor substrate of the recess gate region;

etching the exposed semiconductor substrate at a predetermined thickness to form a recess;

removing the first hard mask layer and the pad oxide film to form a gate oxide film over the exposed semiconductor substrate;

forming a gate conductive layer for filling the recess over the resulting structure;

forming a gate hard mask layer over the gate conductive layer; and patterning the gate hard mask layer and the gate conductive layer with a second gate mask for defining a gate as an etching mask to form a gate.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings.

Figure 3:
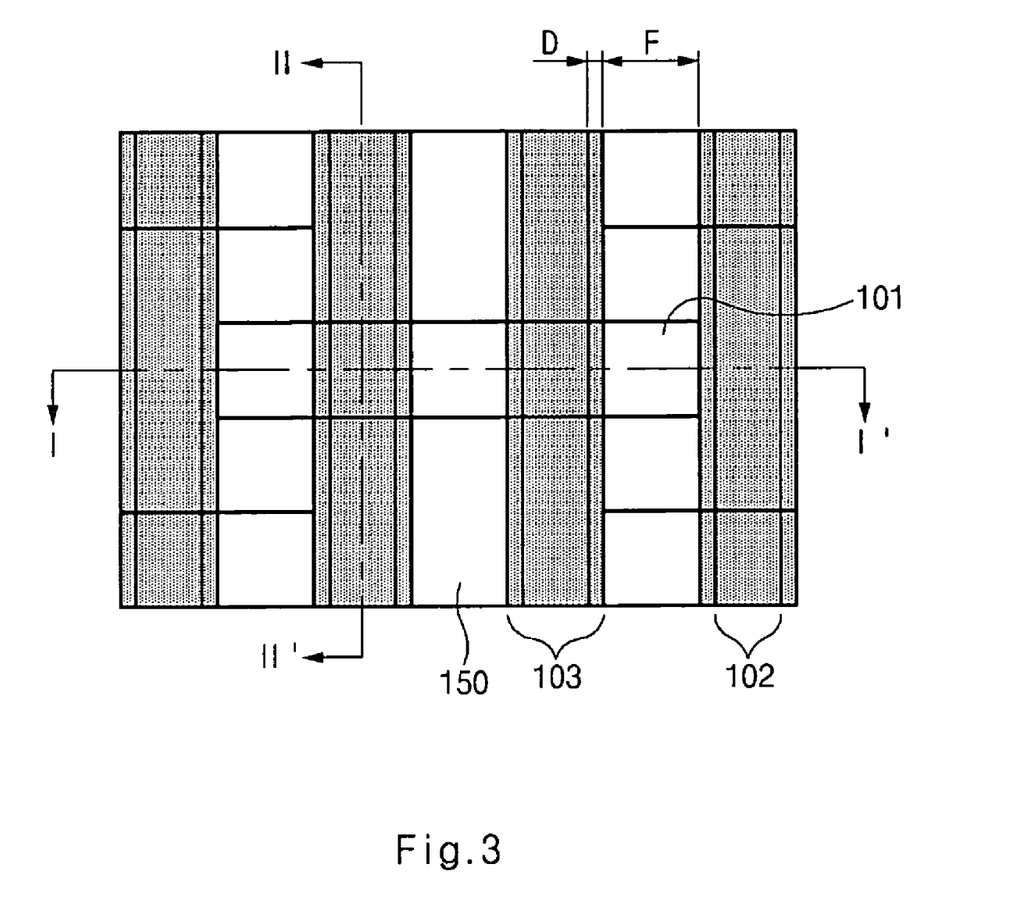
FIG. 3 is a layout diagram illustrating a semiconductor device according to an embodiment of the present invention.

FIG. 3 is a layout diagram illustrating a semiconductor device according to an embodiment of the present invention.

In an embodiment, a semiconductor device includes an active region 101 defined by a device separating film 150, a recess gate region 102 and a gate region 103.

The linewidth of the recess gate region 102 is shown to be narrower by 2D than that of the gate region 103, and the width between the gate regions 103 is shown to be F.

Figure 4A:
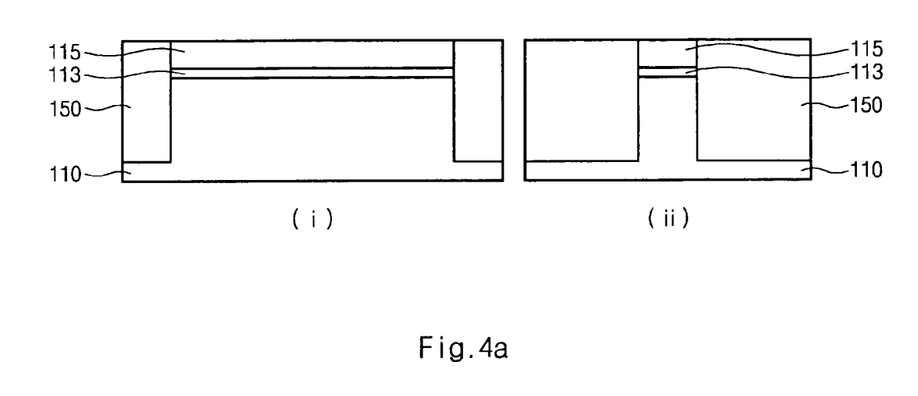
FIGS. 4a through 4f are diagrams illustrating a method for manufacturing a semiconductor device according to an embodiment of the present invention.

FIGS. 4a through 4f are diagrams illustrating a method for manufacturing a semiconductor device according to an embodiment of the present invention. FIGS. 4a(i) through 4f(i) are cross-sectional diagrams taken along the line I-I' of FIG. 3, and FIGS. 4a(ii) through 4f(ii) are cross-sectional diagrams taken along the line II-II' of FIG. 3.

A pad oxide film 113 and a pad nitride film 115 which define the active region of FIG. 3 are formed over a semiconductor substrate 110. Then, the semiconductor substrate 110 is etched at a predetermined thickness with the pad oxide film 113 and the pad nitride film 115 to form a trench. Preferably, the thickness of the pad nitride film 115 ranges 50 to 200 nm.

Thereafter, a device separating oxide film (not shown) for filling the trench is formed, and a CMP process is performed until the pad nitride film 115 is exposed to planarize the device separating oxide film. As a result, a device separating film 150 is formed. Then, a well-channel-ion-implanting process is performed on the active region 101 of FIG. 3 defined by the device separating film.

Figure 4B:
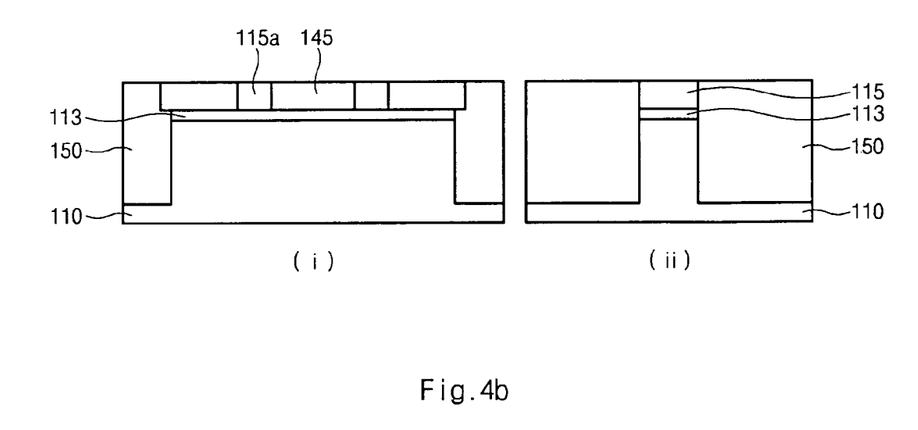

After a photoresist film is formed over the resulting structure, the pad nitride film 115 and the device separating film 150 are etched by an exposing and etching process with a first gate mask (not shown) for defining the line-type recess gate region 102 to expose the pad oxide film 113 except for the recess gate region 102.

After the photoresist film is removed, the exposed region between pad nitride film patterns 115a is filled with a first hard mask layer 145. Then, a CMP process is performed to planarize the first hard mask layer 145. The first hard mask layer 145 is selected from one of an oxide film, a SiON film, an amorphous carbon film, a silicon film and combinations thereof.

Figure 4C:
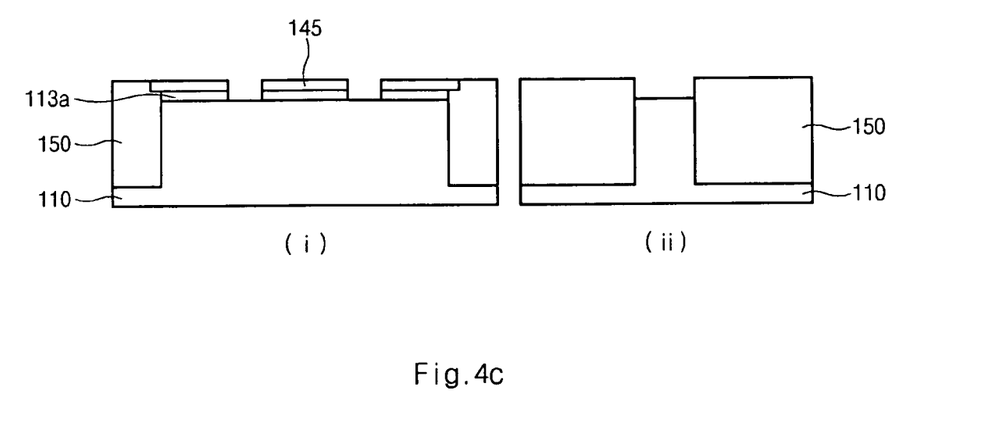

The pad nitride film patterns 115a are removed by a wet-etching process with the hard mask layer 145 and the device separating film 150 as etching masks.

The pad oxide film 113 of the recess gate region is removed to expose the semiconductor substrate of the recess gate region. Here, the device separating film 150 and the first hard mask layer 145 are etched at a predetermined thickness so that the heights of the device separating film 150 and the first hard mask layer 145 are formed to be higher than that of the semiconductor substrate.

Figure 4D:
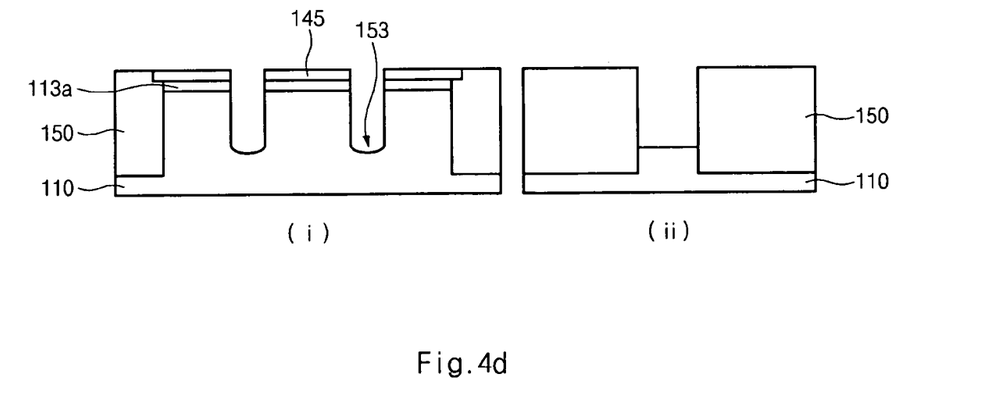

The exposed semiconductor substrate 110 is etched at a predetermined thickness to form a recess 153. After, an oxide film (not shown) is formed over the semiconductor substrate 110 of the recess 153, a channel-ion-implanting process may be performed thereon.

Figure 4E:
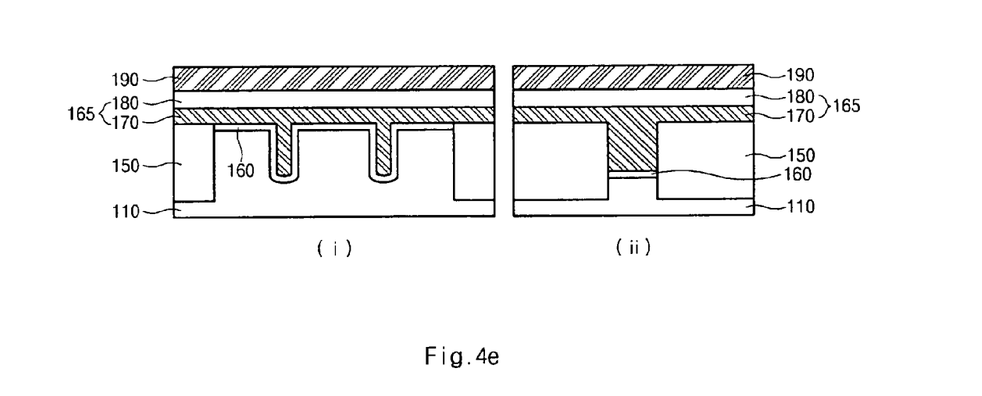

The first hard mask layer 145 can be removed when the semiconductor substrate 110 is etched in FIG. 4d. After the residual first hard mask layer 145 and pad oxide film 113a are removed by a wet-etching process, a gate oxide film 160 is formed over the exposed semiconductor substrate 110.

A gate conductive layer 165 for filling the recess 153 is formed over the resulting structure, and a gate hard mask layer 190 is formed over the gate conductive layer 165. Preferably, the gate conductive layer 165 has a deposition structure including a bottom electrode 170 and a top electrode 180. The bottom electrode 170 is selected from one of n+ polysilicon, p+ polysilicon, TiN and combinations thereof. The top electrode 180 is selected from one of WN/W, WSix/WN/W, Ti/TiN/W, Ti/WN/W, TiN/Ti, TiN, and combinations thereof.

Figure 4F:
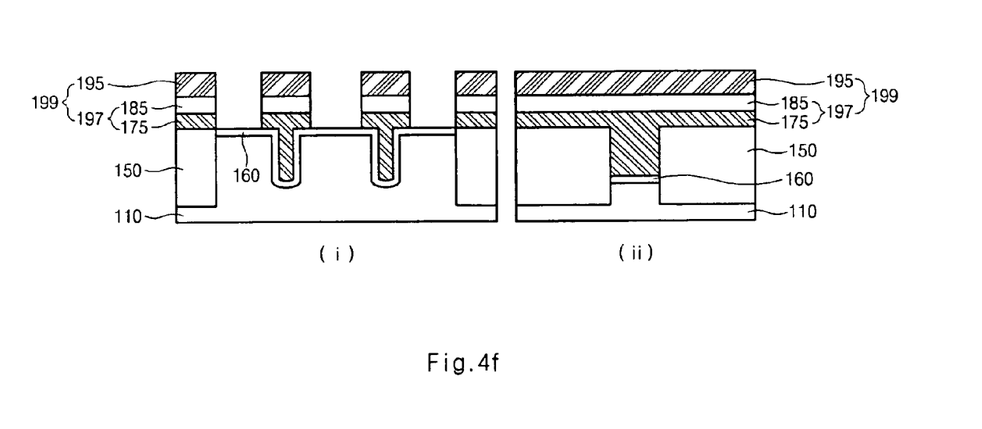

The gate hard mask layer 190 and the gate conductive layer 165 are patterned with a second gate mask (not shown) for defining a gate which is the gate region 103 of FIG. 3 as an etching mask to form a gate 199.

After the photoresist pattern is removed, ions are implanted with the gate 199 as an ion-implanting mask to form a LDD region (not shown) in the semiconductor substrate 110 between the gates 199. Then, a general process for manufacturing a transistor is performed which includes forming a gate sidewall insulating film, a source/drain region, a contact plug, a bit line contact and a bit line, a capacitor contact and a capacitor, and a metal line contact and a metal line, thereby obtaining a semiconductor device.

Figure 5A:
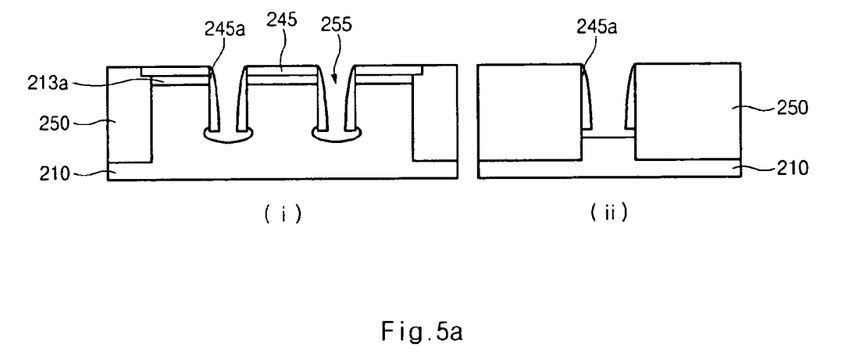
FIGS. 5a through 5c are diagrams illustrating a method for manufacturing a semiconductor device according to an embodiment of the present invention.
Figure 5B:
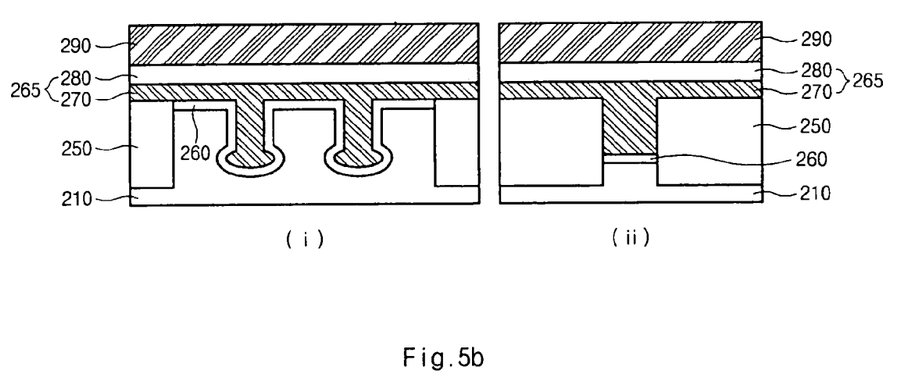
Figure 5C:
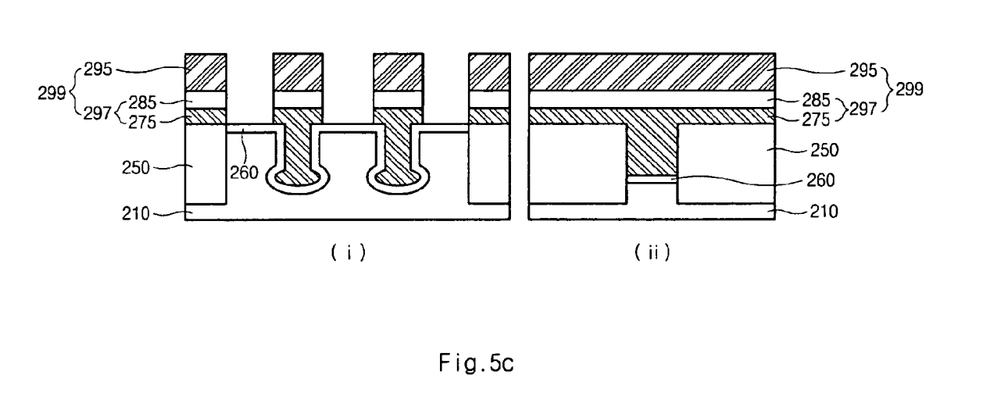

FIGS. 5a through 5c are diagrams illustrating a method for manufacturing a semiconductor device according to an embodiment of the present invention. FIGS. 5a(i) through 5c(i) are cross-sectional diagrams taken along the line I-I' of FIG. 3, and FIGS. 5a(ii) through 5c(ii) are cross-sectional diagrams taken along the line II-II' of FIG. 3.

First, the processes of FIGS. 4a through 4d are performed to form a recess.

A sidewall insulating film 245a is formed at sidewalls of a pad oxide film 213a, a first hard mask layer 245 and a first recess (not shown). The bottom semiconductor substrate 210 of the first recess (not shown) is isotropic-etched with the sidewall insulating film 245a as a mask to form a second recess 255 whose bottom has a circular or elliptical bottom.

The first hard mask layer 245 and the pad oxide film 213a are removed by a wet-etching process to form a gate oxide film 260 over the exposed semiconductor substrate 210.

A gate conductive layer 265 for filling the Second recess 255 is formed over the resulting structure. A gate hard mask layer 290 is formed over the gate conductive layer 265 which has a deposition structure including a bottom electrode 270 and a top electrode 280. The bottom electrode 270 is selected from one of n+ polysilicon, p+ polysilicon, TiN and combinations thereof. The top electrode 280 is selected from one of WN/W, WSix/WN/W, Ti/TiN/W, Ti/WN/W, TiN/Ti, TiN, and combinations thereof.

The gate hard mask layer 290 and the gate conductive layer 265 are patterned with a second gate mask (not shown) for defining a gate of the gate region 103 of FIG. 3 to form a gate 299.

After the photoresist pattern is removed, ions are implanted with the gate 299 as an ion-implanting mask to form a LDD region (not shown) in the semiconductor substrate 210 between the gates 299. Then, a general process for manufacturing a transistor is performed which includes forming a gate sidewall insulating film 295, a source/drain region, a contact plug, a bit line contact and a bit line, a capacitor contact and a capacitor, and a metal line contact and a metal line, thereby obtaining a semiconductor device.

As described above, according to an embodiment of the present invention, a method for manufacturing a semiconductor device including forming a recess with a device separating film and a first hard mask layer so that a pad nitride film for defining a recess gate region may remain with a conventional mask for defining the recess gate region to facilitate a process for etching a gate electrode, to reduce word line capacitance and leakage current of a charge storage voltage.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device, the method comprising the following sequential steps:
    (a) forming a deposition structure including a pad oxide film and a pad nitride film which exposes a device separating region of a semiconductor substrate;
    (b) etching the semiconductor substrate using the pad oxide film as an etching mask to form a trench which defines an active region;
    (c) after said step (b) forming an insulating film for separating the device, wherein the insulating film fills the trench;
    (d) planarizing the insulating film until the pad nitride film is exposed to form a device separating film;
    (e) etching the pad nitride film using a first gate mask such that a residual pad nitride film is formed over a recess gate region to be formed in the active region, wherein the first gate mask defines a line-type recess gate region;
    (f) forming a first hard mask layer over the residual pad nitride film and the pad oxide film;
    (g) planarizing the first hard mask layer until the residual pad nitride film is exposed to form a first hard mask pattern;
    (h) removing the residual pad nitride film, the pad oxide film and the semiconductor substrate to form the recess gate region using the first hard mask pattern as an etching mask to form a recess;
    (j) removing the first hard mask pattern and the pad oxide film;
    (j) forming a gate oxide film over the exposed semiconductor substrate;
    (k) forming a gate conductive layer over the gate oxide film, wherein the gate conductive layer fills the recess;
    (l) forming a gate hard mask layer over the gate conductive layer; and
    (m) patterning the gate hard mask layer and the gate conductive layer using a gate mask as an etching mask to form a gate.

2. The method according to claim 1, wherein the thickness of the pad nitride film ranges from 50 to 200 nm.

3. The method according to claim 1, wherein a well-channel-ion-implanting process is performed on the active region after the device separating film is formed.

4. The method according to claim 1, wherein the first hard mask layer is selected from one of an oxide film, a SiON film, and amorphous carbon film, a silicon film and combinations thereof.

5. The method according to claim 1, wherein removing the residual pad nitride film, the pad oxide film and the semiconductor substrate includes removing pad nitride patterns by a wet-etching process using the first hard mask pattern and the device separating film as etching masks.

6. The method according to claim 1, wherein a channel-ion-implanting is performed after the recess is formed and an oxide film is formed over the semiconductor substrate.

7. The method according to claim 1, wherein removing the first hard mask layer, the pad oxide film and the semiconductor substrate includes performing a wet-etching process.

8. The method according to claim 1, wherein the gate conductive layer has a deposition structure including a bottom electrode and a top electrode.

9. The method according to claim 8, wherein the bottom electrode is selected from one of n+ polysilicon, p+ polysilicon, TiN and combinations thereof.

10. The method according to claim 8, wherein the top electrode is selected from one of WN/W, Wsix/WN/W, Ti/TiN/W, Ti/WN/W, TiN/Ti, TiN and combinations thereof.

11. The method according to claim 1, further including implanting ions using the gate as an ion-implanting mask to form a LDD region.

12. The method according to claim 1, further comprising after forming the recess:
    forming a sidewall insulating film over a sidewall of the pad oxide film, the first hard mask layer and the recess; and
    isotropic-etching the bottom semiconductor substrate of the recess with the sidewall insulating film as a mask.

13. The method according to claim 12, wherein the bottom of the recess is circular or elliptic.

14. The method according to claim 1, wherein planarizing of the insulating film is performed by a CMP process until the pad nitride film is exposed to planarize the device separating oxide film.

* * * * *